US012652010B2

(12) United States Patent
Nakajima

(10) Patent No.: US 12,652,010 B2
(45) Date of Patent: Jun. 9, 2026

(54) COMMON ADJUSTMENT CIRCUIT

(71) Applicant: Socionext Inc., Kanagawa (JP)

(72) Inventor: Ryuji Nakajima, Yokohama (JP)

(73) Assignee: Socionext Inc., Kanagawa (JP)

( * ) Notice: Subject to any disclaimer, the term of this patent is extended or adjusted under 35 U.S.C. 154(b) by 459 days.

(21) Appl. No.: 18/344,482

(22) Filed: Jun. 29, 2023

(65) Prior Publication Data

US 2023/0361735 A1 Nov. 9, 2023

Related U.S. Application Data

(63) Continuation of application No. PCT/JP2021/003553, filed on Feb. 1, 2021.

(51) Int. Cl.
*H03F 3/45* (2006.01)
*H03F 1/30* (2006.01)

(52) U.S. Cl.
CPC ......... *H03F 3/45192* (2013.01); *H03F 1/301* (2013.01); *H03F 3/45273* (2013.01)

(58) Field of Classification Search
CPC .. H03F 3/45192; H03F 1/301; H03F 3/45273; H03F 2203/45488; H03F 3/45632; H03F 2203/45728; H03F 3/45183; H03F 2200/453; H03F 3/45197
USPC ........................................................ 330/253
See application file for complete search history.

(56) References Cited

U.S. PATENT DOCUMENTS 9,007,098 B1 4/2015 Viviani et al.
9,722,555 B1* 8/2017 Nagulapalli ........ H03F 3/45183

2002/0190782 A1 12/2002 Somerville et al.
2005/0184805 A1* 8/2005 Murakami .............. H03F 1/301
330/261
2008/0061745 A1 3/2008 Nodo
2008/0303592 A1 12/2008 Deguchi et al.
2018/0269844 A1 9/2018 Jing et al.

FOREIGN PATENT DOCUMENTS

JP 2008-067188 A 3/2008
JP 2008-306504 A 12/2008
JP 2013-157929 A 8/2013
JP 2020-509649 A 3/2020

OTHER PUBLICATIONS

Japanese Office Action dated Apr. 1, 2025 issued in the corresponding Japanese Patent Application No. 2022-578008, with partial English translation.
International Search Report (ISR) dated Apr. 6, 2021 issued in International Patent Application No. PCT/JP2021/003553, with English translation.

* cited by examiner

*Primary Examiner* — Andrea Lindgren Baltzell
*Assistant Examiner* — Khiem D Nguyen
(74) *Attorney, Agent, or Firm* — Rimon P.C.

(57) ABSTRACT

A common adjustment circuit includes: a first comparator comparing a reference voltage with a voltage between a first transistor and a first resistance and outputting the comparison result; a current mirror circuit including a second transistor allowing an input current to flow through it and a third transistor allowing an output current to flow through it; a replica circuit imitating a differential amplifier; and a second comparator connected to a connection node between the third transistor and a second resistance at one of its inputs and to a replica output node of the replica circuit at the other input, to compare the two inputs and output a bias voltage.

7 Claims, 8 Drawing Sheets

COMMON ADJUSTMENT CIRCUIT

CROSS-REFERENCE TO RELATED APPLICATIONS

This is a continuation of International Application No. PCT/JP2021/003553 filed on Feb. 1, 2021. The entire disclosure of this application is incorporated by reference herein.

BACKGROUND

The present disclosure relates to a common adjustment circuit that adjusts an output common voltage of a differential amplifier.

A differential amplifier is a circuit that amplifies two input signals with a fixed differential gain and outputs the results, and used in a high-speed serial interface performing high-speed operation, for example.

In recent years, manufacturing processes of semiconductor integrated circuits are becoming increasingly finer, and the resulting decrease in power supply voltage makes difficult the circuit design for ensuring stable operation.

In a differential amplifier, it is important to stabilize the output voltage at its output terminals at a time when the voltage difference at its differential input terminals is 0 (the output common voltage) and the potential difference between the power supply voltage and the output common voltage (the voltage head room). For example, when the output common voltage is unstable, the voltage head room becomes insufficient, causing a problem that the operation of the circuit becomes unstable.

To address the above problem, a common adjustment circuit for stabilizing the output common voltage is used. For example, Japanese Unexamined Patent Publication No. 2008-306504 describes a common adjustment circuit using a replica circuit and a comparator.

In the cited patent document, as a method of generating a reference voltage for the comparator in the common adjustment circuit, disclosed are a configuration based on resistance division and a configuration using a resistance and a constant current source. However, when variations of components caused by manufacturing processes occur, configurations as those described in the cited patent document may fail to sufficiently secure the voltage head room, resulting in a possibility of the operation becoming unstable. Specifically, when process variations and power supply voltage fluctuations occur, for example, a deviation may arise in reference voltage. If this arises, the voltage head room may become small.

In particular, a circuit required to deliver high performance in a high-speed operation environment, such as a high-speed serial interface, is susceptible to noise and a ripple of the output common voltage caused by a deviation in reference voltage. Therefore, such a circuit will be affected more prominently when the voltage head room becomes insufficient.

An objective of the present disclosure is providing a common adjustment circuit that works so that the voltage head room of a differential amplifier is kept from varying even when process variations and power supply voltage fluctuations occur.

SUMMARY

A common adjustment circuit according to one mode of the present disclosure relates to a common adjustment circuit configured to output a first bias voltage to be applied to a gate of an output load transistor of a differential amplifier. The common adjustment circuit includes: a first comparator connected to a reference voltage at one of its inputs and to a first node at the other input, comparing the two inputs and outputting a comparison result; a first transistor connected to an output of the first comparator at its gate, to the first node at its source, and to a second node at its drain; a first resistance connected to the first node at one of its terminals and to a first power supply at the other terminal; a current mirror circuit including a second transistor connected to the second node at its gate and drain and allowing an input current to flow through it, and a third transistor connected to the second node at its gate and allowing an output current to flow through it; a second resistance connected to a source of the third transistor at one of its terminals via a third node; a second comparator connected to the third node at one of its inputs and to a fourth node at the other input, comparing the two inputs and outputting the first bias voltage; and a replica circuit including a replica transistor corresponding to the output load transistor of the differential amplifier, a gate of the replica transistor being connected to an output of the second comparator, a replica output node corresponding to an output node of the differential amplifier being connected to the fourth node.

A common adjustment circuit according to another mode of the present disclosure relates to a common adjustment circuit configured to output a bias voltage to be applied to a gate of an output load transistor of a differential amplifier. The common adjustment circuit includes: a first comparator connected to a reference voltage at one of its inputs and to a first node at the other input, comparing the two inputs and outputting a comparison result; a first transistor connected to an output of the first comparator at its gate, to the first node at its drain, and to a second node at its source; a first resistance connected to the first node at one of its terminals and to a first power supply at the other terminal; a second resistance connected to the second node at one of its terminals and to a second power supply different in potential from the first power supply at the other terminal; a second comparator connected to the second node at one of its inputs and to a third node at the other input, comparing the two inputs and outputting the bias voltage; and a replica circuit including a replica transistor corresponding to the output load transistor of the differential amplifier, a gate of the replica transistor being connected to an output of the second comparator, a replica output node corresponding to an output node of the differential amplifier being connected to the third node.

According to the present disclosure, it is possible to provide a common adjustment circuit that works so that the voltage head room of a differential amplifier is kept from varying even when process variations and power supply voltage fluctuations occur.

BRIEF DESCRIPTION OF THE DRAWINGS

FIG. 1 is a circuit diagram showing a configuration of a common adjustment circuit of the first embodiment.

FIG. 5 is a circuit diagram showing a configuration of a differential amplifying circuit including a common adjustment circuit according to Alteration 1 of the first embodiment.

DETAILED DESCRIPTION

Embodiments of the present disclosure will be described hereinafter with reference to the accompanying drawings. It is to be noted that specific numerical values presented in the following embodiments are merely illustrative for easy understanding of the invention and by no means intended to limit the scope of the invention.

A common adjustment circuit is a circuit aimed at stabilizing the output common voltage of a differential amplifier to be described later by applying a bias voltage to the gate of an output load transistor of the differential amplifier. In other words, the common adjustment circuit is a circuit that generates a bias voltage for securing a predetermined output common voltage in the differential amplifier and feeds the generated bias voltage to the gate of the output load transistor of the differential amplifier. The output common voltage is an output voltage at the output terminals at a time when the voltage difference at the differential input terminals is 0 as described earlier.

The common adjustment circuit according to the present disclosure is configured to work so that the voltage head room of the differential amplifier is kept from varying even when process variations and power supply voltage fluctuations occur. The voltage head room of the differential amplifier will be first described hereinafter, and then the common adjustment circuit according to the present disclosure will be described with specific circuit examples presented.

—Voltage Head Room—

First, the voltage head room will be described.

\<Differential Amplifier\>

Figure 2:
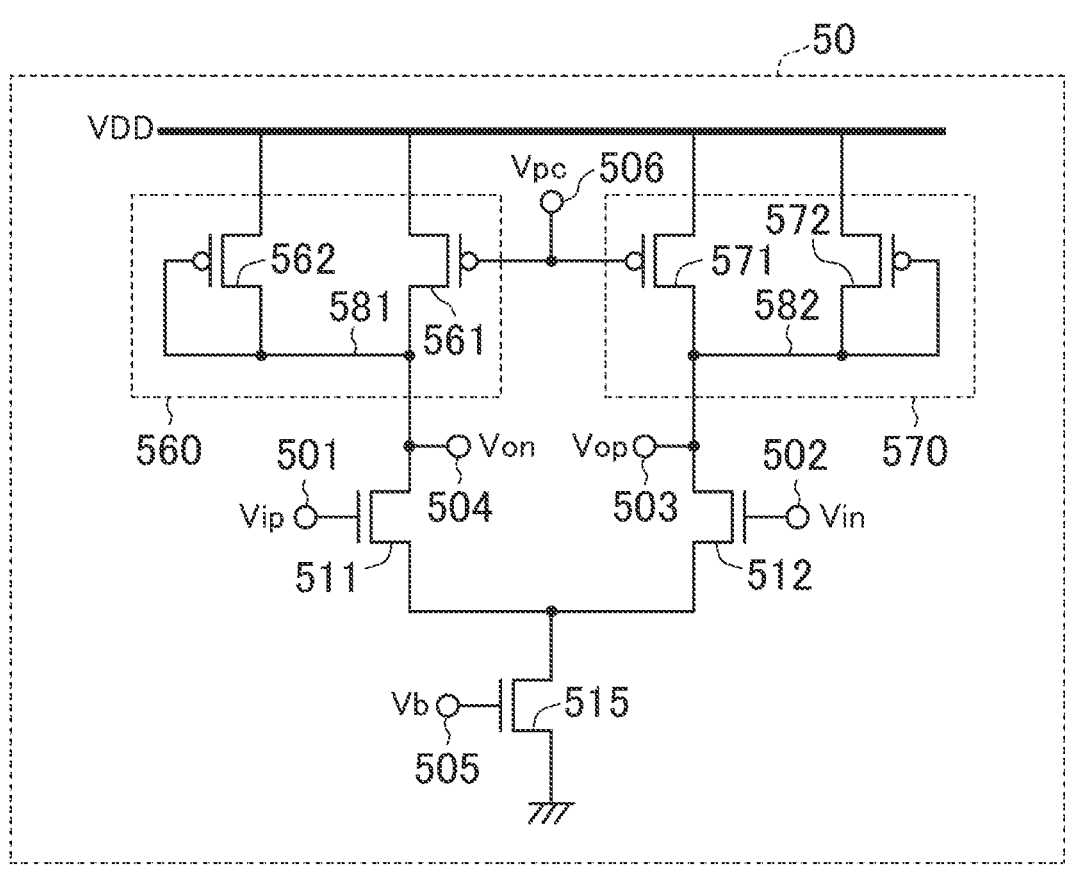
FIG. 2 is a circuit diagram showing an example of a differential amplifier to which the common adjustment circuit is connected.

FIG. 2 shows an example of a differential amplifier 50 to which a common adjustment circuit 10 according to the present disclosure is connected.

The differential amplifier 50 amplifiers a differential input signal Vi (Vip and Vin) input from paired input terminals 501 and 502 and outputs the results from paired output terminals 503 and 504 as a differential output signal Vo (vop and Von). In the following description, the same reference character may be used for both the name of a signal and the voltage value of the signal. Also, VDD to be described later may be used for both the name of the power supply and the voltage value.

The differential amplifier 50 includes a differential transistor pair (n-type transistors 511 and 512), paired output load circuits 560 and 570, and an n-type transistor 515 operating as a tail current source.

The n-type transistor 511 is connected to the input terminal 501 at its gate, to the drain of the transistor 515 at its source, and to the output load circuit 560 and the output terminal 504 at its drain. The n-type transistor 512 is connected to the input terminal 502 at its gate, to the drain of the transistor 515 at its source, and to the output load circuit 570 and the output terminal 503 at its drain. The transistors 511 and 512 are configured to have the same electrical characteristics. The output load circuits 560 and 570 are configured to have the same electrical characteristics.

The output load circuit 560 includes p-type transistors 561 and 562 provided in parallel between the power supply VDD and the output terminal 504. The drains of the transistors 561 and 562 are connected to the output terminal 504 via a node 581. The gate of the transistor 562 is connected to the node 581. A bias voltage Vpc output from a second comparator 19 is fed to the gate of the transistor 561 via an input terminal 506.

The output load circuit 570 includes p-type transistors 571 and 572 provided in parallel between the power supply VDD and the output terminal 503. The drains of the transistors 571 and 572 are connected to the output terminal 503 via a node 582. The gate of the transistor 572 is connected to the node 582. The bias voltage Vpc is fed to the gate of the transistor 571 via the input terminal 506.

A bias voltage Vb is fed to the gate of the transistor 515 via an input terminal 505. With the application of a voltage equal to or higher than the threshold voltage of the transistor 515 to the gate of the transistor 515 as the bias voltage Vb, the transistor 515 operates as a constant current source (hereafter referred to as a tail current source).

Figures 3, 4A, 4B:
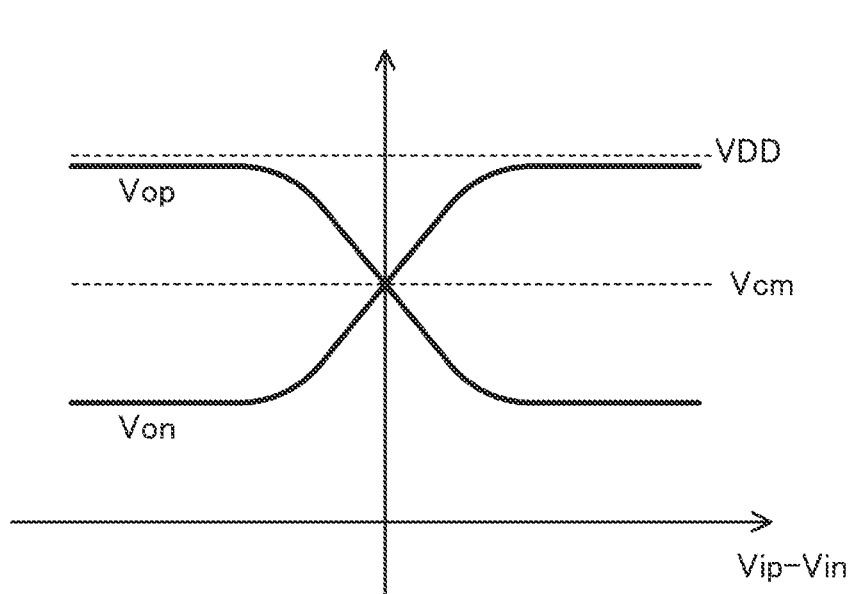
FIG. 3 is a view for explaining a voltage head room.
FIGS. 4A-4B are views for explaining the voltage head room.

FIG. 3 shows changes of the output signals Vop and Von with respect to the difference between the input signals Vip and Vin, i.e., "Vip–Vin" as the horizontal axis. FIG. 4A shows a change of the differential input signal Vi with the time axis, and FIG. 4B shows a change of the differential output signal Vo with the time axis.

In FIG. 3, the output common voltage Vcm of the differential output signal Vo is expressed by Equation (1):

$$Vcm = VDD - \frac{Rd \cdot Is}{2} \tag{1}$$

where VDD is the power supply voltage of the differential amplifier 50, Rd is the combined impedance of the output load circuit 560 or the combined impedance of the output load circuit 570, and Is is the current flowing to the tail current source (transistor 515). From Equation (1), it is found that the output common voltage Vom of the differential amplifier 50 is determined by the current Is flowing from the power supply voltage VDD and a voltage drop of the combined impedance Rd of the output load circuit 560 (570).

Also, the relationship between a fluctuating component vin of the differential input signal Vi (the remainder after removal of the DC component of the input signal from the voltage of the differential input signal Vi) and a fluctuating component vout of the differential output signal Vo (the remainder after removal of the output common voltage Vom from the voltage value of the differential output signal Vo) is expressed by Equation (2):

$$vout = -gm \cdot Rd \cdot vin \tag{2}$$

where gm is the transfer conductance of the differential transistor pair (n-type transistors 511 and 512).

Also, the voltage head room Vh of the differential amplifier 50 is expressed by Equation (3):

$$Vh = VDD - Vcm \tag{3}$$

As shown by Equation (3), the voltage head room Vh is the potential difference between the power supply voltage and the output common voltage Vcm, representing a margin of the voltage amplitude with which a signal can be taken without distortion as the differential output signal Vo. Therefore, if the voltage head room Vh becomes too small to secure a sufficient voltage amplitude margin, problems such as distortion of the differential output signal Vo will occur. For example, when the differential amplifier 50 is used for a high-speed interface, there may arise a possibility of failing to sufficiently secure the signal quality according to specifications. The common adjustment circuit according to the present disclosure is presented to solve this problem.

First Embodiment

—Common Adjustment Circuit—

Figure 1:
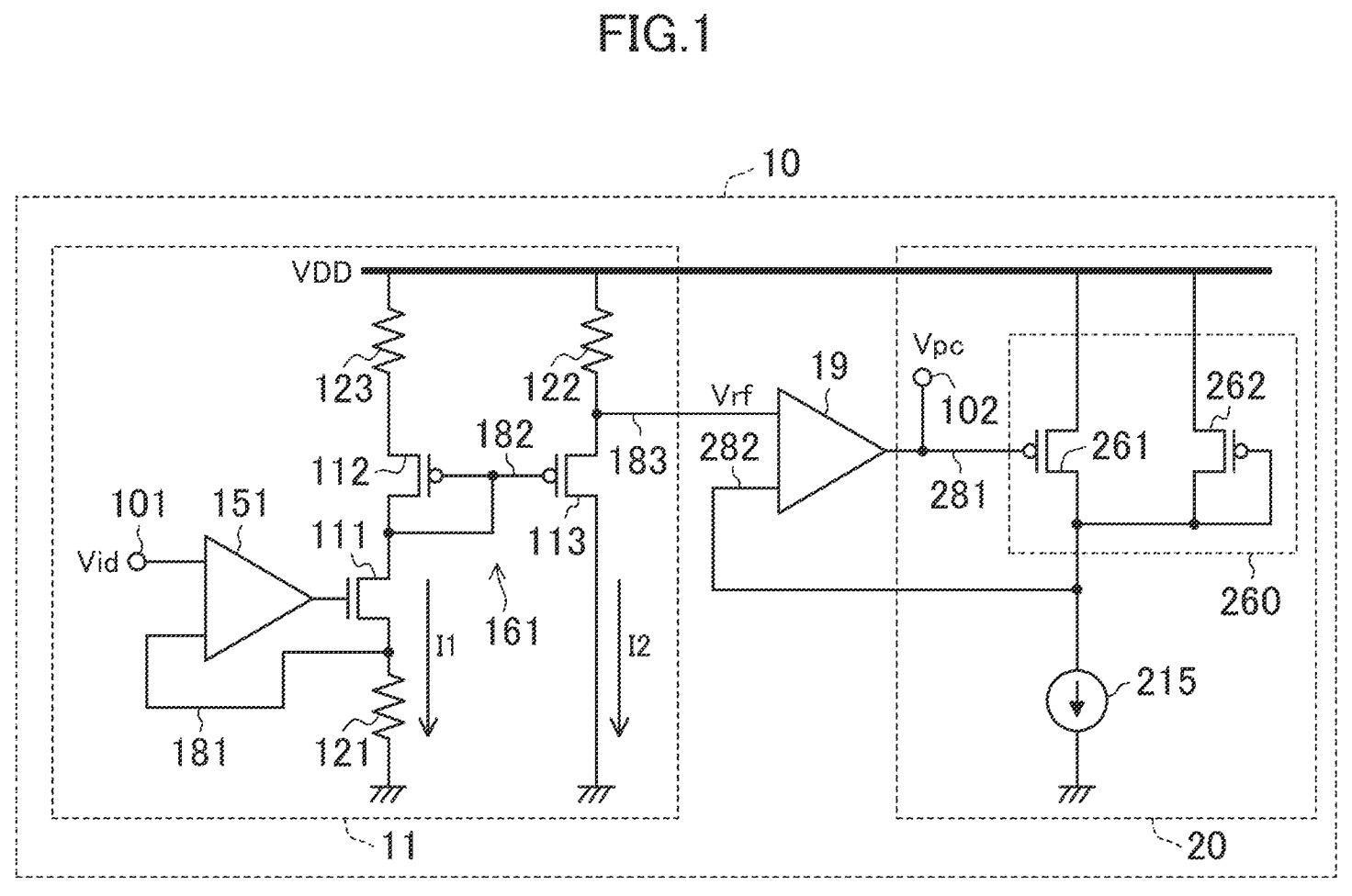

The common adjustment circuit of this embodiment will be described hereinafter with reference to the relevant drawings. FIG. 1 is a circuit diagram showing a configuration example of the common adjustment circuit of the first embodiment.

As shown in FIG. 1, the common adjustment circuit 10 includes a reference voltage generation circuit 11 for generating a reference voltage Vrf, the second comparator 19, and a replica circuit 20.

—Reference Voltage Generation Circuit—

The reference voltage generation circuit 11 includes a first comparator 151, a first transistor 111, a first resistance 121, a second resistance 122, and a current mirror circuit 161.

The first comparator 151 receives a reference voltage Vid at one of its inputs via an input terminal 101 and is connected to the source of the first transistor 111 at the other input via a first node 181. The first comparator 151 compares the reference voltage Vid with the source voltage of the first transistor 111 and outputs the comparison result to the gate of the first transistor 111. With this, the voltage of the first node 181 is adjusted to the reference voltage Vid.

The reference voltage Vid is supplied from a circuit that has succeeded in reducing variations in manufacturing process and voltage fluctuations caused by changes in use environments such as power supply voltage fluctuations and temperature fluctuations. The reference voltage Vid may be supplied from a conventionally-known bandgap reference circuit, for example.

The first resistance 121 is provided between the first node 181 and the ground VSS (corresponding to the first power supply). With this, a current I1 expressed by Equation (4) below flows through the first transistor 111.

$$I1 = Vid/R1 \tag{4}$$

where R1 is the resistance value of the first resistance 121.

The current mirror circuit 161 includes a second p-type transistor 112 through which the current I1 as the input current (hereinafter referred to as the input current I1) flows and a third p-type transistor 113 through which an output current I2 flows. The output current I2 can be adjusted by changing the ratio in size between the second transistor 112 and the third transistor 113 and by changing the reference voltage Vid and the resistance value R1 of the first resistance 121, for example.

The gate and drain of the second transistor 112 are connected to the drain of the first transistor 111 via a second node 182. The source of the second transistor 112 is connected to the power supply VDD (corresponding to the second power supply) via a third resistance 123.

The gate of the third transistor 113 is connected to the second node 182. That is, the gates of the second and third transistors 112 and 113 are mutually connected. The drain of the third transistor 113 is connected to the ground VSS, and the source of the third transistor 113 is connected to the power supply VDD via the second resistance 122. For convenience of description, the node connecting the source of the third transistor 113 and the second resistance 122 is called a "third node 183." The third node 183 is connected to one input of the second comparator 19. As a result, the reference voltage Vrf expressed by Equation (5) below is fed to one input of the second comparator 19.

$$Vrf = VDD - I2 \cdot R2 = VDD - \frac{I2}{I1} \cdot \frac{R2}{R1} \cdot Vid \tag{5}$$

where R2 is the resistance value of the second resistance 122.

—Second Comparator—

The second comparator 19 receives the reference voltage Vrf at one of its inputs as described above and is connected to an output node 282 (corresponding to the replica output node) of the replica circuit 20 at the other input. The second comparator 19 compares the reference voltage Vrf with the output of the replica circuit 20 and outputs the comparison result to a node 281. The node 281 is connected to an output terminal 102 and to the gate of a replica transistor 261 of the replica circuit 20 to be described later.

—Replica Circuit—

The replica circuit 20 is a circuit configured to imitate the circuit configuration of the differential amplifier 50 to which the common adjustment circuit 10 is connected. That is, the replica circuit 20 is a circuit that changes its configuration with the differential amplifier 50 to which the common adjustment circuit 10 is connected. In FIG. 1, shown is the replica circuit 20 tailored to the case of the common adjustment circuit 10 connected to the above-described differential amplifier 50 shown in FIG. 2.

The replica circuit 20 includes a replica load circuit 260 imitating the output load circuit 560 and a replica current source 215 imitating the transistor 515 operating as the tail current source. The replica load circuit 260 is configured to have the same electrical characteristics as the output load circuit 560. The replica current source 215 is configured so that a half of the current flowing through the transistor 515 flows thereto.

The replica load circuit 260 includes the p-type replica transistor 261 and a p-type replica transistor 262 provided in parallel between the power supply VDD and the output node 282. The gate of the replica transistor 261 is connected to the output of the second comparator 19 via the node 281. That is, the same voltage as that fed to the gate of the transistor 561 of the output load circuit 560 is fed to the gate of the replica transistor 261. The drains of the replica transistors 261 and 262 are connected to the other input of the second comparator 19 via the output node 282. The gate of the replica transistor 262 is connected to the output node 282. The replica transistor 261 is configured to have the same electrical characteristics as the transistor 561, and the replica transistor 262 is configured to have the same electrical characteristics as the transistor 562.

With the above configuration, the voltage of the output node 282 of the replica circuit 20 is adjusted to the reference voltage Vrf. The output node 282 of the replica circuit 20 corresponds to the output nodes connected to the output terminals 503 and 504 of the differential amplifier 50. This indicates that the output common voltage Vcm at the output terminals 503 and 504 of the differential amplifier 50 is adjusted to the reference voltage Vrf.

Therefore, from Equation (5) above, the output common voltage Vcm of the differential amplifier 50 is expressed by Equation (6) below, and from Equation (6) and Equation (3) above, the voltage head room Vh of the differential amplifier 50 is expressed by Equation (7) below.

$$Vcm = VDD - \frac{I2}{I1} \cdot \frac{R2}{R1} \cdot Vid \qquad (6)$$

$$Vh = \frac{I2}{I1} \cdot \frac{R2}{R1} \cdot Vid \qquad (7)$$

As shown by Equation (7) above, in the common adjustment circuit 10 of this embodiment, the voltage head room Vh does not depend on the power supply VDD, and depends only on the resistance ratio between the first resistance 121 and the second resistance 122 and the current ratio between the input current I1 and the output current I2. In general, resistive elements in the same circuit have similar tendency in process variations. Therefore, the resistance ratio between the first resistance 121 and the second resistance 122 is substantially unaffected by manufacturing variations. Also, the current mirror circuit 161 is configured to be substantially unaffected by fluctuations in power supply voltage and changes in temperature such as the use environment temperature if any, and therefore capable of providing a highly accurate ratio I2/I1. Similarly, the reference voltage Vid can be made substantially unaffected by fluctuations in power supply voltage. Therefore, the common adjustment circuit 10 works so that the voltage head room Vh of the differential amplifier 50 does not fluctuate even if process variations and power supply voltage fluctuations occur, whereby the prior art problems are solved. Details will be discussed in "Comparative Examples" to follow.

Moreover, according to the common adjustment circuit 10 of this embodiment, the voltage head room Vh can be easily changed by changing the mirror ratio I2/I1 of the current mirror circuit 161 and the resistance ratio R2/R1.

Comparative Example 1

In Comparative Example 1, as shown in FIG. 10 of the cited Patent Document, the common voltage generation circuit is configured of a load element (resistance value: Rx) and a constant current source (current value: Ix) serially connected between the power supply voltage and the ground potential, and its output is output to a differential amplifier via the comparator. In this case, the reference voltage Vx input into the comparator corresponding to the second comparator 19 according to the present disclosure and the voltage head room Vhx of the target differential amplifier are expressed by Equation (8) and Equation (9), respectively.

$$Vx = VDD - Rx \cdot Ix \qquad (8)$$

$$Vhx = VDD - Vx = Rx \cdot Ix \qquad (9)$$

In the case of the configuration of Comparative Example 1, the resistance value Rx of the load element fluctuates with variations in manufacturing process. With this fluctuation, the voltage head room Vhx of the target differential amplifier fluctuates, causing a possibility of the operation of the circuit becoming unstable. This also holds true when a transistor element is used as the resistance in place of the resistive element since a transistor is also affected by variations in manufacturing process. However, the configuration of this embodiment is unaffected by such manufacturing variations of resistive elements and transistor elements.

Comparative Example 2

In Comparative Example 2, as shown in FIG. 11 of the cited Patent Document, the common voltage generation circuit is configured of a resistance voltage dividing circuit of a resistance ratio Ry1/Ry2, and its output is output to a differential amplifier via the comparator. In this case, the reference voltage Vy input into the comparator corresponding to the second comparator 19 according to the present disclosure and the voltage head room Vhy of the target differential amplifier are expressed by Equation (10) and Equation (11), respectively.

$$Vy = VDD \times \frac{Ry2}{(Ry1 + Ry2)} \qquad (10)$$

$$Vhy = VDD - Vy = VDD\left(1 - \frac{Ry2}{Ry1 + Ry2}\right) \qquad (11)$$

As shown by Equation (11), in the case of Comparative Example 2, when the power supply voltage VDD fluctuates, the voltage head room Vhy of the target differential amplifier fluctuates, causing a possibility of the operation of the circuit becoming unstable. However, the configuration of this embodiment is unaffected by such power supply voltage fluctuations.

Alteration 1 of First Embodiment

Figure 5:
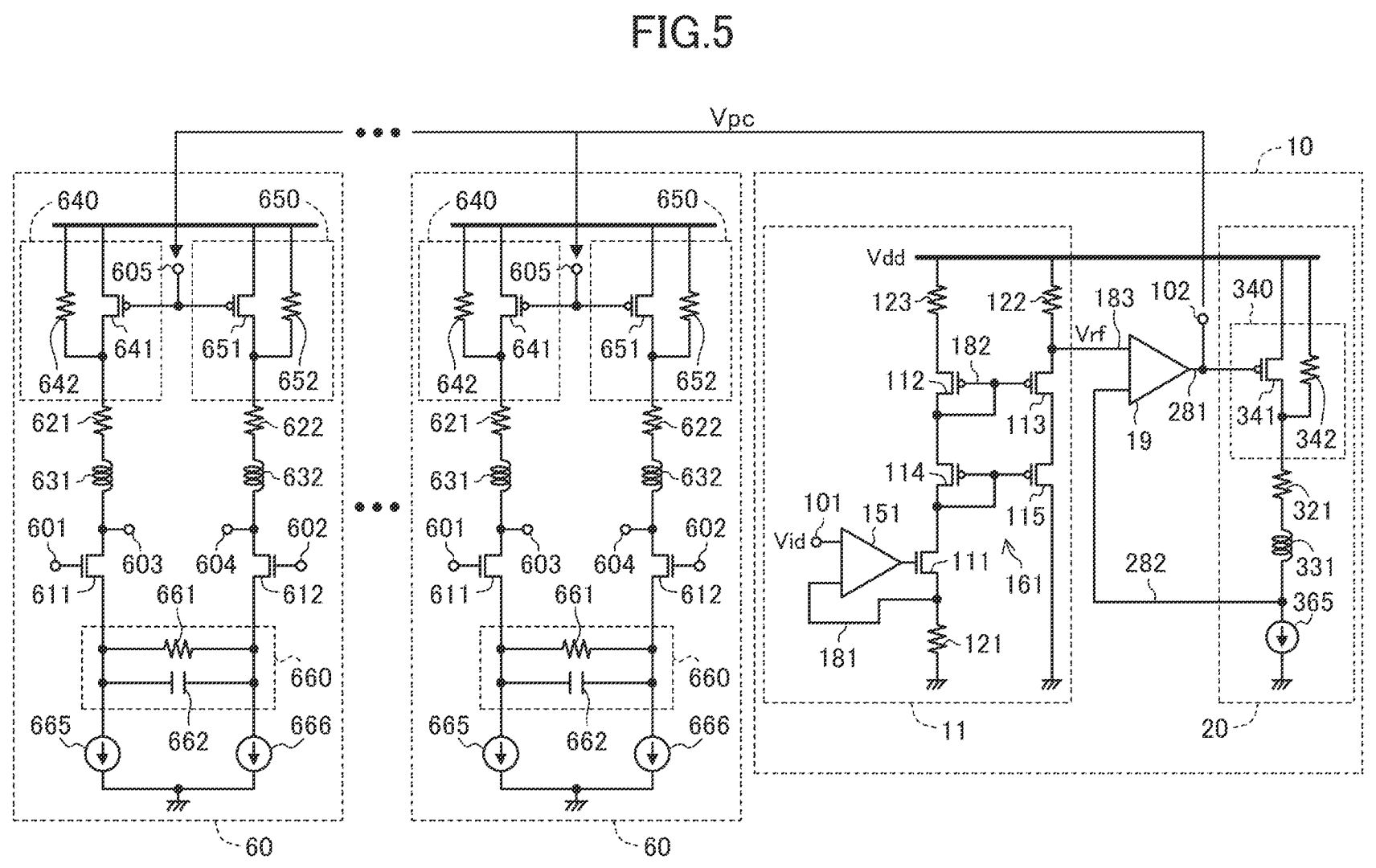

FIG. 5 is a circuit diagram showing a configuration of a differential amplifying circuit including a common adjustment circuit 10 of Alteration 1 of the first embodiment and differential amplifiers 60. In this alteration, description will be made centering on differences from the first embodiment (FIGS. 1 and 2), and description of common components will be omitted in some cases.

In the common adjustment circuit 10, the current mirror circuit 161 is a cascode-type circuit. Specifically, in this alteration, a fourth transistor 114 is provided between the second transistor 112 and the first transistor 111, and a fifth transistor 115 is provided between the third transistor 113 and the ground VSS. That is, the fourth transistor 114 and the fifth transistor 115 are cascode-connected to the second transistor 112 and the third transistor 113. This further improves the accuracy of the mirror ratio of the current mirror circuit 161, and thus can further improve the accuracy of the reference voltage Vrf (output common voltage Vcm) and the voltage head room Vh.

FIG. 5 shows an example in which the configuration of the differential amplifier 60 is different from that of the differential amplifier 50, and therefore the configuration of the replica circuit 20 is different from that in FIG. 1. The differential amplifier in FIG. 5 is used as a continuous time linear equalizer for a front end of a high-speed interface, for example.

In FIG. 5, the differential amplifying circuit includes a plurality of differential amplifiers 60 having the same configuration and electrical characteristics. Each of the differential amplifiers 60 amplifies a differential input signal Vi input from paired input terminals 601 and 602 and outputs the results from paired output terminals 603 and 604 as a differential output signal Vo.

The differential amplifier 60 includes a differential transistor pair (n-type transistors 611 and 612), paired output load circuits 640 and 650, a source load 660, and tail current sources 665 and 666. The source of the transistor 611 is connected to the ground VSS via the tail current source 665, and the source of the transistor 612 is connected to the ground VSS via the tail current source 666. The source load 660 has a configuration of a resistance 661 and a capacitor 662 connected in parallel between the source of the transistor 611 and the source of the transistor 612. In the differential amplifier 60, the transistors 611 and 612, and the output load circuits 640 and 650, are configured to have the same respective electrical characteristics. Also, the tail current sources 665 and 666 are configured to supply the same current.

The output load circuit 640 corresponds to the output load circuit 560 in FIG. 2, but is different from the circuit in FIG. 2 in that the former is a parallel circuit of a p-type transistor 641 and a resistance 642. Also, in FIG. 5, a resistance 621 and a peaking inductor 631 are serially connected between the output load circuit 640 and the output terminal 603. The output load circuit 650 corresponds to the output load circuit 570 in FIG. 2, but is different from the circuit in FIG. 2 in that the former is a parallel circuit of a p-type transistor 651 and a resistance 652. Also, in FIG. 5, a resistance 622 and a peaking inductor 632 are serially connected between the output load circuit 650 and the output terminal 604. The p-type transistors 641 and 651 are configured to have the same electrical characteristics, and the resistances 642 and 652 are configured to have the same electrical characteristics. Also, the resistances 621 and 622 are configured to have the same electrical characteristics, and the peaking inductors 631 and 632 are configured to have the same electrical characteristics.

In FIG. 5, the replica circuit 20 is different from the circuit in FIG. 1 in that the former is configured imitating the circuit configuration of the differential amplifier 60. The replica circuit 20 includes a replica load circuit 340 imitating the output load circuit 640, a replica resistance 321 imitating the resistance 621, a replica inductor 331 imitating the peaking inductor 631, and a replica current source 365 imitating the tail current source 665. The replica load circuit 340 is a parallel circuit of a replica transistor 341 imitating the p-type transistor 641 and a replica resistance 342 imitating the resistance 642. The replica load circuit 340 is configured to have the same electrical characteristics as the output load circuit 640: i.e., the replica transistor 341 and the replica resistance 342 are configured to have the same electrical characteristics as the transistor 641 and the resistance 642, respectively. The replica current source 365 is configured so that the same current as the current flowing to the current source 665 flows thereto.

With the above configuration, as in the above embodiment, the output common voltage Vcm of the differential amplifier 60 is expressed by Equation (6) above, and the voltage head room Vh of the differential amplifier 60 is expressed by Equation (7) above. That is, by using the common adjustment circuit 10 of this alteration, the voltage head room Vh of the differential amplifier 60 does not depend on the power supply VDD and depends only on the resistance ratio between the first resistance 121 and the second resistance 122 and the current ratio between the input current I1 and the output current I2. Therefore, the common adjustment circuit 10 works so that the voltage head room Vh of the differential amplifier 60 does not fluctuate even if process variations and power supply voltage fluctuations occur, whereby the prior art problems are solved. Also, the voltage head room Vh can be easily changed.

Moreover, the differential amplifying circuit according to this alteration has a plurality of differential amplifiers 60 same in the configuration of the output load circuit 640, and the bias voltage Vpc is supplied to these amplifiers from the shared common adjustment circuit 10. It is therefore possible for the common adjustment circuit 10 to work, for the plurality of differential amplifiers 60, so that their voltage head rooms Vh do not fluctuate even if process variations and power supply voltage fluctuations occur, while minimizing increase in area. Although not illustrated, high gain can be obtained by cascading a plurality of stages of differential amplifiers 60, for example. In such a case, the configuration of this alteration can be used advantageously.

Alteration 2 of First Embodiment

Figure 6:
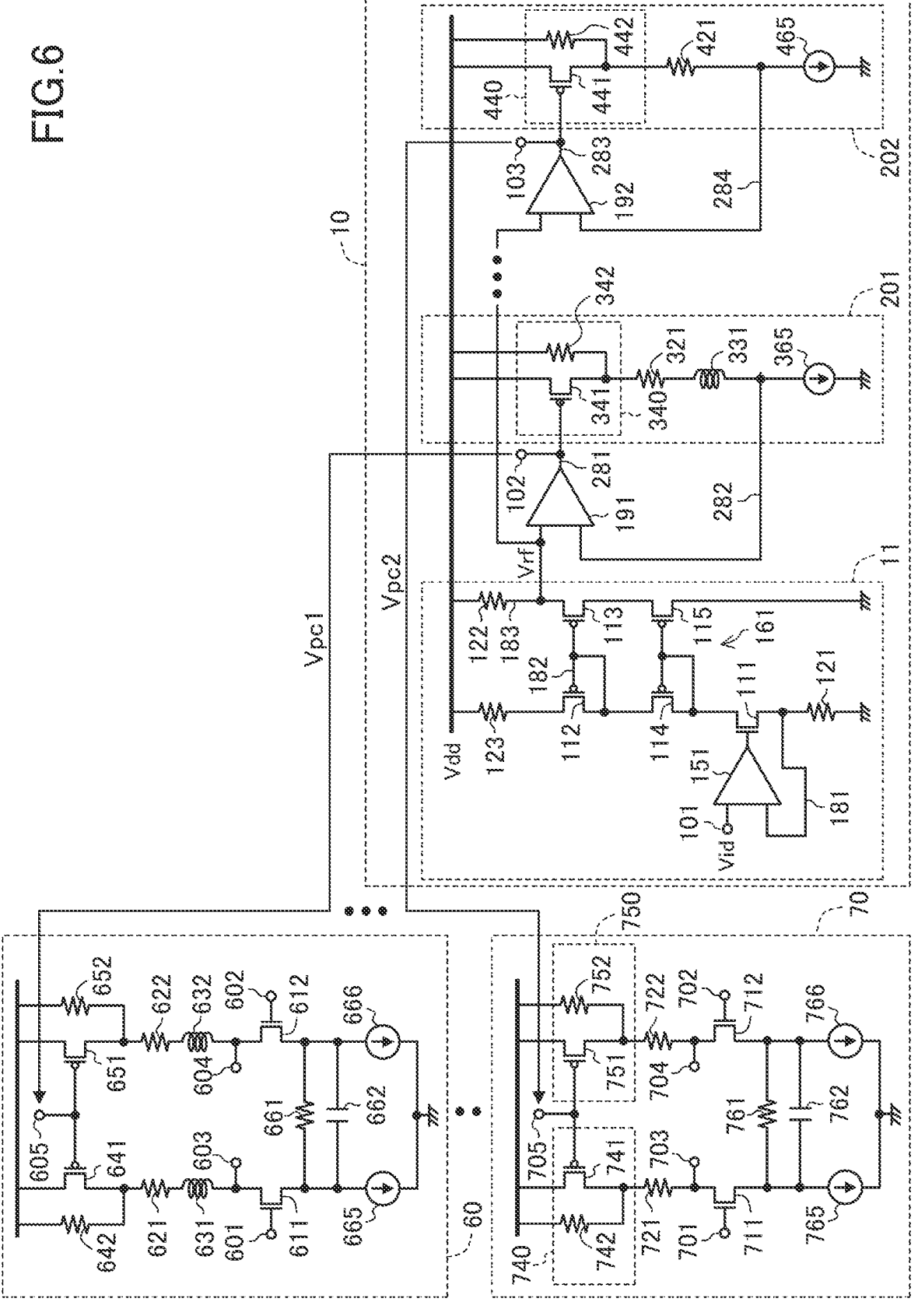
FIG. 6 is a circuit diagram showing a configuration of a differential amplifying circuit including a common adjustment circuit according to Alteration 2 of the first embodiment.

FIG. 6 is a circuit diagram showing a configuration of a differential amplifying circuit including a common adjustment circuit 10 of Alteration 2 of the first embodiment and differential amplifiers 60 and 70. In this alteration, description will be made centering on differences from Alteration 1 (FIG. 5), and description of common components will be omitted in some cases.

The differential amplifying circuit of FIG. 6 includes a plurality of differential amplifiers 60 and 70 different in configuration. Although two differential amplifiers 60 and 70 are illustrated here for the sake of convenience and the differential amplifier 60 is the same in configuration as that in Alteration 1, the number of differential amplifiers is not limited to two, and a combination of differential amplifiers different from one in FIG. 6 is also acceptable.

In FIG. 6, as comparators corresponding to the second comparator 19 in FIG. 5, provided are a third comparator 191 provided for a first replica circuit 201 and a third comparator 192 provided for a first replica circuit 202.

The third comparator 191 is connected to the third node 183 at one of its inputs to receive the reference voltage Vrf and connected to the output node 282 (corresponding to the replica output node) of the first replica circuit 201 at the other input. The third comparator 191 compares the reference voltage Vrf with the output of the first replica circuit 201 and outputs the comparison result (a bias voltage Vpc1) to the node 281. The node 281 is connected to the output terminal 102 and to the gate of the replica transistor 341 of the first replica circuit 201. The output terminal 102 is connected to an input terminal 605 of the differential amplifier 60. The third comparator 191 feeds the bias voltage Vpc1 to the gates of the transistors 641 and 651 to be described later.

The third comparator 192 is connected to the third node 183 at one of its inputs to receive the reference voltage Vrf and connected to an output node 284 (corresponding to the replica output node) of the first replica circuit 202 at the other input. The third comparator 192 compares the reference voltage Vrf with the output of the first replica circuit 202 and outputs the comparison result (a bias voltage Vpc2) to a node 283. The node 283 is connected to an output terminal 103 and to the gate of a replica transistor 441 of the first replica circuit 202. The output terminal 103 is connected to an input terminal 705 of the differential amplifier 70. The third comparator 192 feeds the bias voltage Vpc2 to the gates of transistors 741 and 751 of the differential amplifier 70.

The differential amplifier 70 amplifies a differential input signal Vi received from paired input terminals 701 and 702 and outputs the results from paired output terminals 703 and 704 as a differential output signal Vo. The differential amplifier 70 has a configuration obtained by omitting the peaking inductors 631 and 632 from the differential amplifier 60. In FIG. 6, any components of the differential amplifiers 60 and 70 having reference numerals of which the last two digits are the same correspond to each other, and detailed description of such components is omitted here. In the differential amplifier 70, transistors 711 and 712, output load circuits 740 and 750, and resistances 721 and 722 are configured to have the same respective electrical characteristics. Also, tail current sources 765 and 766 are configured to supply the same current.

In FIG. 6, the replica circuit 20 includes the first replica circuit 201 configured to imitate the circuit configuration of the differential amplifier 60 and the first replica circuit 202 configured to imitate the circuit configuration of the differential amplifier 70.

The first replica circuit 201 has the same configuration as the replica circuit 20 in FIG. 5. The first replica circuit 202 includes a replica load circuit 440 imitating the output load circuit 740, a replica resistance 421 imitating the resistance 721, and a replica current source 465 imitating the tail current source 765.

The replica load circuit 440 is a parallel circuit of the replica transistor 441 imitating the p-type transistor 741 and a replica resistance 442 imitating the resistance 742. The replica load circuit 440 is configured to have the same electrical characteristics as the output load circuit 740: i.e., the replica transistor 441 and the replica resistance 442 are configured to have the same electrical characteristics as the transistor 741 and the resistance 742, respectively. The replica resistance 421 is configured to have the same electrical characteristics as the resistance 721. The replica current source 465 is configured so that the same current as the current flowing to the tail current source 765 flows thereto.

With the above configuration, as in the above embodiment, the output common voltage Vcm of the differential amplifier 60 and the output common voltage Vcm of the differential amplifier 70 are expressed by Equation (6) above. Also, the voltage head room Vh of the differential amplifier 60 and the voltage head room Vh of the differential amplifier 70 are expressed by Equation (7) above.

That is, by using the common adjustment circuit 10 of this alteration, the voltage head room Vh of the differential amplifier 60 does not depend on the power supply VDD and depends only on the resistance ratio between the first resistance 121 and the second resistance 122 and the current ratio between the input current I1 and the output current I2. Therefore, the common adjustment circuit 10 works so that the voltage head room Vh of the differential amplifier 60 does not fluctuate even if process variations and power supply voltage fluctuations occur, whereby the prior art problems are solved. Also, the voltage head room Vh can be easily changed. This also holds true for the differential amplifier 70.

Moreover, in this alteration, even when there are a plurality of types of differential amplifiers 60 and 70 having different configurations, it is possible to supply, to the respective differential amplifiers 60 and 70, the bias voltages Vpc1 and Vpc2 working so that their voltage head rooms Vh do not fluctuate, while minimizing increase in the number of circuits.

Alteration 3 of First Embodiment

Figure 7:
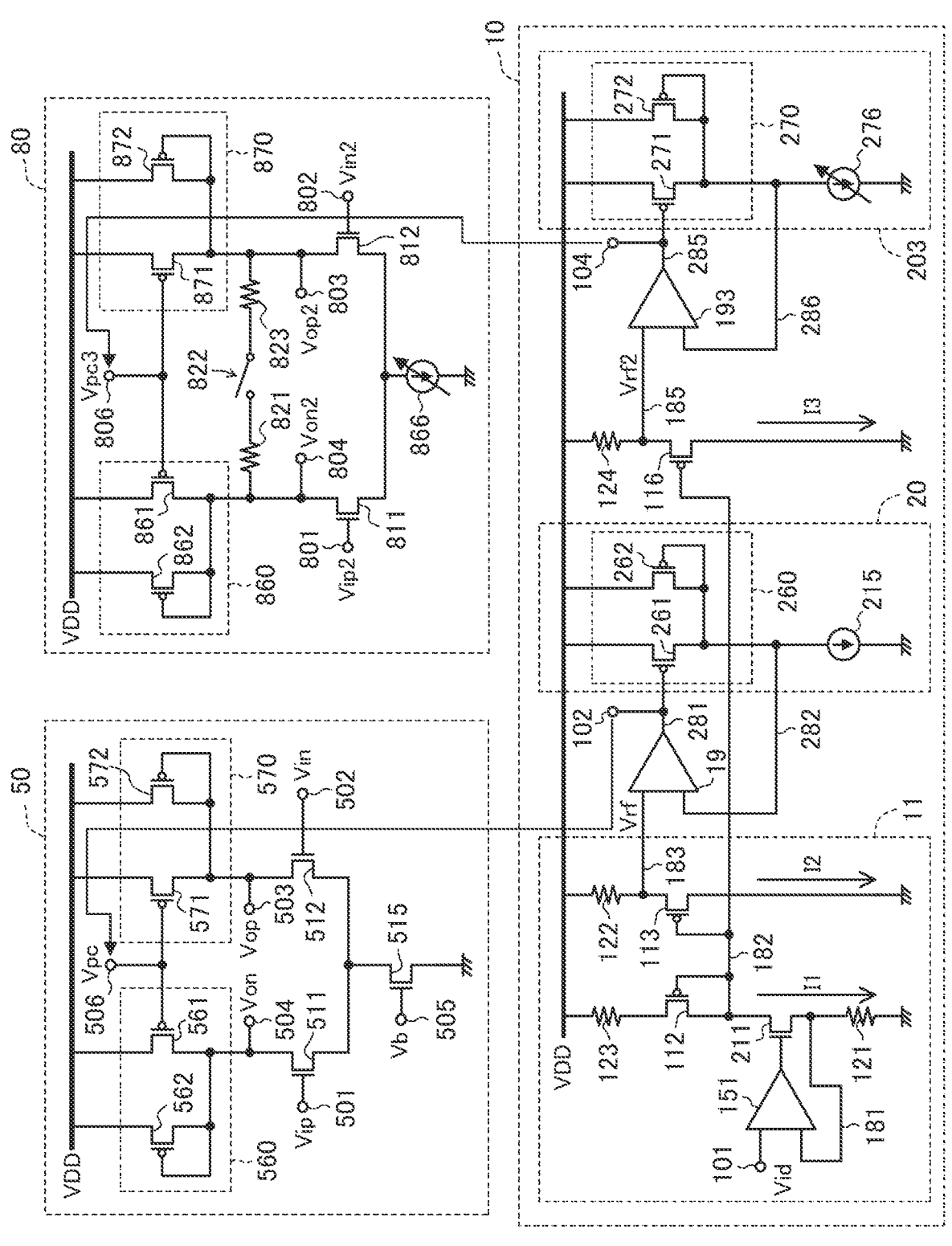
FIG. 7 is a circuit diagram showing a configuration of a differential amplifying circuit including a common adjustment circuit according to Alteration 3 of the first embodiment.

FIG. 7 is a circuit diagram showing a configuration of a differential amplifying circuit including a common adjustment circuit 10 of Alteration 3 of the first embodiment and differential amplifiers 50 and 80. In this alteration, description will be made centering on differences from the first embodiment (FIGS. 1 and 2), and description of common components will be omitted in some cases. The configuration of the differential amplifier 50 and the part of the common adjustment circuit 10 corresponding to this is the same as that in FIG. 1. In this alteration, therefore, the configuration of the differential amplifier 80 and the part of the common adjustment circuit 10 corresponding to this will be described.

In FIG. 7, the gate of a sixth transistor 116 is connected to the second node 182, so that the gates of the second transistor 112 and sixth transistor 116 are mutually connected. With this, an output current I3 flows through the sixth transistor 116. The output current I3 can be adjusted by changing the ratio in size between the second transistor 112 and the sixth transistor 116 and by changing the reference voltage Vid and the resistance value R1 of the first resistance 121, for example.

The drain of the sixth transistor 116 is connected to the ground VSS, and the source of the sixth transistor 116 is connected to the power supply VDD via a fourth resistance 124. For convenience of description, the node connecting the source of the sixth transistor 116 and the fourth resistance 124 is called a "fifth node 185." The fifth node 185 is connected to one input of a third comparator 193. As a result, a reference voltage Vrf2 expressed by Equation (12) below is fed to one input of the third comparator 193.

$$Vrf2 = VDD - I3 \cdot R4 = VDD - \frac{I3}{I1} \cdot \frac{R4}{R1} \cdot Vid \qquad (12)$$

where R4 is the resistance value of the fourth resistance 124.

The third comparator 193 receives the reference voltage Vrf2 at one of its inputs as described above, and is connected to an output node 286 (corresponding to the replica output node) of a second replica circuit 203 at the other input. The third comparator 193 compares the reference voltage Vrf2 with the output of the second replica circuit 203 and outputs the comparison result to a node 285. The output node 285 is connected to an output terminal 104 and to the gate of a replica transistor 271 of the second replica circuit 203 to be described later. The output terminal 104 is connected to an input terminal 806 of the differential amplifier 80. The third comparator 193 feeds a bias voltage Vpc3 to the gates of a transistor 861 and a transistor 871 of the differential amplifier 80.

The differential amplifier 80 amplifiers a differential input signal Vi2 (Vip2 and Vin2) input from paired input terminals 801 and 802 and outputs the results from paired output terminals 803 and 804 as a differential output signal Vo2 (Vop2 and Von2). The circuit configuration of the differential amplifier 80 is different from that of the differential amplifier 50 in that, in addition to the configuration of the differential amplifier 50, a serial circuit of a resistance 821, a switch 822, and a resistance 823 connected in series is connected between the output terminal 803 and the output terminal 804. Also, a variable current source 866 is used as the tail current source. With these additional components, it is possible to change the gain without changing the output common voltage Vcm, and possible to change the output amplitude independently of the common adjustment circuit 10. Note that, in FIG. 7, any components of the differential amplifiers 50 and 80 having reference numerals of which the last two digits are the same correspond to each other, and description of such components is omitted here in some cases. In the differential amplifier 80, transistors 811 and 812, output load circuits 860 and 870, and the resistances 821 and 823 are configured to have the same respective electrical characteristics.

In FIG. 7, the second replica circuit 203 includes a replica load circuit 270 imitating the output load circuit 860 and a replica current source 276 imitating the variable current source 866. The replica load circuit 270 is a parallel circuit of the replica transistor 271 imitating the p-type transistor 861 and a replica transistor 272 imitating a p-type transistor 862. The replica load circuit 270 is configured to have the same electrical characteristics as the output load circuit 860: i.e., the replica transistor 271 is configured to have the same electrical characteristics as the transistor 861, and the replica transistor 272 is configured to have the same electrical characteristics as the transistor 862. The replica current source 276 is configured so that a half of the current flowing to the variable current source 866 flows thereto.

With the above configuration, as in the embodiment described above, the output common voltage Vcm of the differential amplifier 80 is expressed by Equation (13) below. Also, the voltage head room Vh of the differential amplifier 80 is expressed by Equation (14) below.

$$Vcm = VDD - \frac{I3}{I1} \cdot \frac{R4}{R1} \cdot Vid \qquad (13)$$

$$Vh = \frac{I3}{I1} \cdot \frac{R4}{R1} \cdot Vid \qquad (14)$$

As shown by Equation (14) above, by using the common adjustment circuit 10 of this alteration, the voltage head room Vh of the differential amplifier 80 does not depend on the power supply VDD and depends only on the resistance ratio between the first resistance 121 and the fourth resistance 124 and the current ratio between the input current I1 and the output current I3. Therefore, the common adjustment circuit 10 works so that the voltage head room Vh of the differential amplifier 80 does not fluctuate even if process variations and power supply voltage fluctuations occur, whereby the prior art problems are solved. Also, the voltage head room Vh can be easily changed. This also holds true for the differential amplifier 50.

Moreover, in this alteration, it is possible to implement the common adjustment circuit 10 supplying the bias voltages Vpc and Vpc3 respectively to the differential amplifiers 50 and 80 that are set at output common voltages different from each other, while minimizing increase in circuit scale.

Second Embodiment

Figure 8:
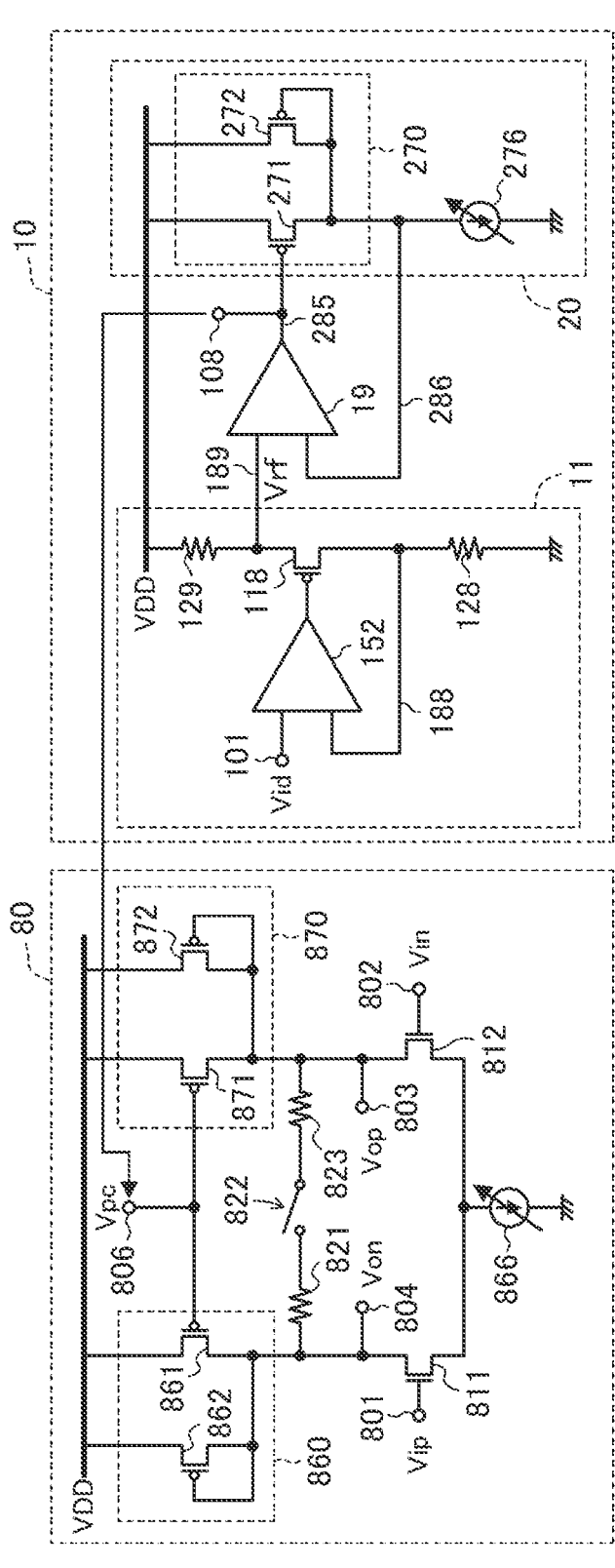
FIG. 8 is a circuit diagram showing a configuration of a common adjustment circuit of the second embodiment.

FIG. 8 is a circuit diagram showing a configuration example of a common adjustment circuit of the second embodiment.

As shown in FIG. 8, the common adjustment circuit 10 includes a reference voltage generation circuit 11 for generating a reference voltage Vrf, a second comparator 19, and a replica circuit 20. In this embodiment, shown is an example using the differential amplifier 80 described in Alteration 3 of the first embodiment (FIG. 7) as the target differential amplifier. Therefore, the configuration of the replica circuit 20 in FIG. 8 is the same as that of the second replica circuit 203 in FIG. 7. Note that the differential amplifier 50, 60, or 70 may also be used in this embodiment, and in such a case, the configuration of the replica circuit 20 will be different.

—Reference Voltage Generation Circuit—

The reference voltage generation circuit 11 includes a first comparator 152, a first transistor 118, a first resistance 128, and a second resistance 129.

The first comparator 152 receives a reference voltage Vid at one of its inputs via an input terminal 101 and is connected to the drain of the p-type first transistor 118 at the other input via a first node 188. The first comparator 152 compares the reference voltage Vid with the drain voltage of the first transistor 118 and outputs the comparison result to the gate of the first transistor 118. With this, the voltage of the first node 188 is adjusted to the reference voltage Vid. As in the first embodiment, the reference voltage Vid is supplied from a circuit that has succeeded in reducing variations in manufacturing process and voltage fluctuations caused by changes in use environments such as power supply voltage fluctuations and temperature fluctuations (e.g., a bandgap reference circuit).

The first resistance 128 is provided between the first node 188 and the ground VSS (corresponding to the first power supply). With this, a current I1 expressed by Equation (4) above flows through the first transistor 118. In Equation (4), R1 is the resistance value of the first resistance 128. The source of the first transistor 118 is connected to the power supply VDD via the second resistance 129. For convenience of description, the node connecting the source of the first transistor 118 and the second resistance 129 is called a "second node 189." The second node 189 is connected to one input of the second comparator 19. As a result, the reference voltage Vrf expressed by Equation (15) below is fed to one input of the second comparator 19.

$$Vrf = VDD - I1 \cdot R2 = VDD - \frac{R2}{R1} \cdot Vid \qquad (15)$$

where R2 is the resistance value of the second resistance 129.

—Second Comparator—

The second comparator 19 receives the reference voltage Vrf at one of its inputs as described above and is connected to the output node 286 (corresponding to the replica output node) of the replica circuit 20 at the other input. The second comparator 19 compares the reference voltage Vrf with the output of the replica circuit 20 and outputs the comparison result to the node 285. The node 285 is connected to an output terminal 108 and to the gate of the replica transistor 271 of the replica circuit 20. As described above, the voltage of the output node 286 is adjusted to the reference voltage Vrf.

Therefore, from Equation (15) above, the output common voltage Vcm of the differential amplifier 80 is expressed by Equation (16) below, and from Equation (16) and Equation (3) above, the voltage head room Vh of the differential amplifier 80 is expressed by Equation (17) below.

$$Vcm = VDD - \frac{R2}{R1} \cdot Vid \qquad (16)$$

$$Vh = \frac{R2}{R1} \cdot Vid \qquad (17)$$

As described above, according to this embodiment, as in the first embodiment, implemented is the common adjustment circuit 10 that works so that the voltage head room Vh of the differential amplifier 80 does not depend on the power supply VDD and depends only on the resistance ratio between the first resistance 128 and the second resistance 129. Moreover, in this embodiment, it is possible to set the voltage head room Vh with a smaller number of parameters than in the first embodiment.

Application Example

Figure 9:
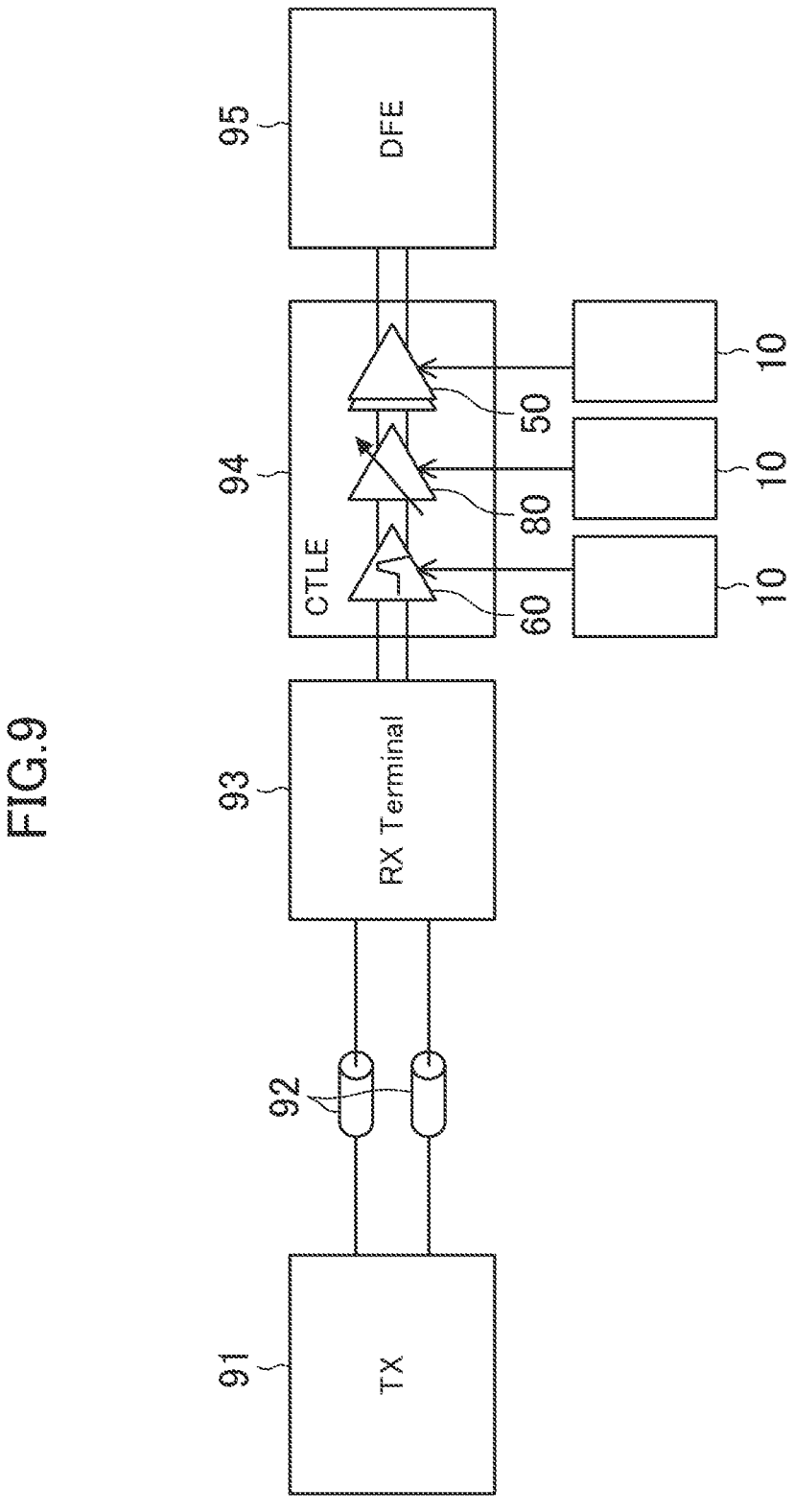
FIG. 9 is a view showing a configuration example of an interface device equipped with a common adjustment circuit according to the present disclosure.

FIG. 9 shows an example where a differential amplifier to which the common adjustment circuit of any of the above embodiments is connected is used as a continuous time linear equalizer 94 for an analog front end (receiver circuit) of a high-speed interface device.

In FIG. 9, data output from a transmitter circuit 91 of a high-speed interface is input into the continuous time linear equalizer 94 via a cable 92 and a terminal circuit 93 of a receiver circuit.

The continuous time linear equalizer 94 has a configuration of cascade connection of the differential amplifier 60 shown in FIG. 5, the differential amplifier 80 shown in FIG. 8, and the differential amplifier 50 shown in FIG. 2. The differential amplifier 60 recovers an attenuated gain. The differential amplifier 80 adjusts the amplitude of the gain-adjusted data to fall within the input range of a subsequent decision feedback equalizer 95. The common adjustment circuits 10 described hitherto are connected to the respective differential amplifiers 60, 80, and 50. Note that the applications of the differential amplifiers 50, 60, 70, and 80 and the common adjustment circuits 10 are not limited to the high-speed interface. Also, as described in Alterations 1-3, the bias voltage Vpc may be supplied to a plurality of differential amplifiers 50, 60, 70, and 80 by a smaller number of common adjustment circuits 10 than the number of differential amplifiers.

The common adjustment circuit according to the present disclosure is significantly useful because it works so that the voltage head room of a differential amplifier does not fluctuate even if process variations and power supply voltage fluctuations occur.

What is claimed is:

1. A common adjustment circuit configured to output a first bias voltage to be applied to a gate of an output load transistor of a differential amplifier, comprising:

a first comparator connected to a reference voltage at one of its inputs and to a first node at the other input, comparing the two inputs and outputting a comparison result;

a first transistor connected to an output of the first comparator at its gate, to the first node at its source, and to a second node at its drain;

a first resistance connected to the first node at one of its terminals and to a first power supply at the other terminal;

a current mirror circuit including a second transistor connected to the second node at its gate and drain and allowing an input current to flow through it, and a third transistor connected to the second node at its gate and allowing an output current to flow through it;

a second resistance connected to a source of the third transistor at one of its terminals via a third node;

a second comparator connected to the third node at one of its inputs and to a fourth node at the other input, comparing the two inputs and outputting the first bias voltage; and a replica circuit including a replica transistor corresponding to the output load transistor of the differential amplifier, a gate of the replica transistor being connected to an output of the second comparator, a replica output node corresponding to an output node of the differential amplifier being connected to the fourth node.

2. The common adjustment circuit of claim 1, further comprising:

a third resistance connected to a source of the second transistor at one of its terminals and to a second power supply different in potential from the first power supply at the other terminal, wherein the other terminal of the second resistance is connected to the second power supply.

3. The common adjustment circuit of claim 2, wherein the current mirror circuit is a cascode-type current mirror circuit in which a fourth transistor provided between the second transistor and the first transistor and a fifth transistor provided between the third transistor and the first power supply are cascode-connected.

4. The common adjustment circuit of claim 1, wherein the replica circuit has a plurality of first replica circuits each having the replica transistor and the replica output node, the first replica circuits being different in configuration from each other, the second comparator has a plurality of third comparators each provided to correspond to each of the plurality of first replica circuits, and each of the third comparators is connected to the third node at one of its inputs and to the replica output node of the corresponding first replica circuit at the other input.

5. The common adjustment circuit of claim 1, wherein the current mirror circuit includes a sixth transistor connected to the second node at its gate, allowing an output current to flow through it, and the common adjustment circuit further includes a fourth resistance connected to a source of the sixth transistor at one of its terminals via a fifth node, a third comparator connected to the fifth node at one of its inputs and to a sixth node at the other input, comparing the two inputs and outputting a second bias voltage to be applied to a gate of an output load transistor of a second differential amplifier different from the former differential amplifier, and a second replica circuit including a replica transistor corresponding to the output load transistor of the second differential amplifier, a gate of the replica transistor being connected to an output of the third comparator, a replica output node corresponding to an output node of the second differential amplifier being connected to the sixth node.

6. A common adjustment circuit configured to output a bias voltage to be applied to a gate of an output load transistor of a differential amplifier, comprising:

a first comparator connected to a reference voltage at one of its inputs and to a first node at the other input, comparing the two inputs and outputting a comparison result;

a first transistor connected to an output of the first comparator at its gate, to the first node at its drain, and to a second node at its source;

a first resistance connected to the first node at one of its terminals and to a first power supply at the other terminal;

a second resistance connected to a third node at one of its terminals and to a second power supply different in potential from the first power supply at the other terminal;

a second comparator connected to the third node at one of its inputs and to a fourth node at the other input, comparing the two inputs and outputting the bias voltage; and a replica circuit including a replica transistor corresponding to the output load transistor of the differential amplifier, a gate of the replica transistor being connected to an output of the second comparator, a replica output node corresponding to an output node of the differential amplifier being connected to the fourth node.

7. The common adjustment circuit of claim 6, wherein the replica circuit has a plurality of first replica circuits each having the replica transistor and the replica output node, each of the first replica circuits being different in configuration from each other, the second comparator has a plurality of third comparators each provided to correspond to each of the plurality of first replica circuits, and each of the third comparators is connected to the third node at one of its inputs and to the replica output node of the corresponding first replica circuit at the other input.

\* \* \* \* \*